(12) United States Patent
Malka et al.

(10) Patent No.: US 9,151,608 B2
(45) Date of Patent: Oct. 6, 2015

(54) APPARATUS, TOOL, AND METHOD FOR MODIFYING A PORTION OF A FLOOR PLAN BASED ON MEASUREMENTS MADE BY ONE OR MORE SENSORS

(76) Inventors: Francis Ruben Malka, St-Lambert (CA); Gilles Jean Desforges, St-Lambert (CA)

( * ) Notice: Subject to any disclaimer, the term of this patent is extended or adjusted under 35 U.S.C. 154(b) by 1201 days.

(21) Appl. No.: 13/077,950

(22) Filed: Mar. 31, 2011

(65) Prior Publication Data

US 2012/0253725 A1 Oct. 4, 2012

(51) Int. Cl.
G06F 19/00 (2011.01)
G01C 15/00 (2006.01)
G01C 21/20 (2006.01)
G06F 17/50 (2006.01)

(52) U.S. Cl.
CPC .............. G01C 15/00 (2013.01); G01C 21/206 (2013.01); *G06F 17/5004* (2013.01)

(58) Field of Classification Search
CPC ... G01C 15/00; G01C 21/206; G06F 17/5004
USPC .......... 702/94, 155; 340/665, 539.13, 539.22; 33/228, 280, 286, 1 G; 73/198; 703/1
See application file for complete search history.

(56) References Cited

U.S. PATENT DOCUMENTS

| 8,087,176 B1 * | 1/2012 | Hayes et al. ................. 33/280 |
| 8,712,686 B2 * | 4/2014 | Bandyopadhyay et al. .. 701/446 |
| 2003/0009315 A1 * | 1/2003 | Thomas et al. .................... 703/1 |
| 2004/0073360 A1 | 4/2004 | Foxlin |
| 2004/0122628 A1 * | 6/2004 | Laurie .............................. 703/1 |
| 2005/0186972 A1 | 8/2005 | Ogino et al. |
| 2008/0210000 A1 * | 9/2008 | Yoshitome ...................... 73/198 |
| 2009/0015399 A1 * | 1/2009 | Burneske et al. ......... 340/539.13 |
| 2010/0061185 A1 | 3/2010 | Kyun et al. |
| 2012/0013475 A1 * | 1/2012 | Farley et al. ................. 340/665 |
| 2012/0203502 A1 * | 8/2012 | Hayes et al. .................. 702/155 |

FOREIGN PATENT DOCUMENTS

| EP | 0715150 A1 | 9/1999 |
| EP | 1818687 A1 | 8/2007 |
| WO | WO 0101075 A2 | 1/2001 |
| WO | WO 2004006181 A2 | 1/2004 |
| WO | WO 2011144968 A1 | 11/2011 |

OTHER PUBLICATIONS

Reina A et al: "A two-stage mobile robot localization method by overlapping segment-based maps", Robotics and Autonomous Systems vol. 31 No. 4, Jun. 30, 2000, pp. 213-225.

(Continued)

*Primary Examiner* — Carol S Tsai

(57) ABSTRACT

An apparatus, tool, and method for modifying a portion of a floor plan based on measurements made by one or more sensors. The apparatus comprises a correction unit for compensating the sensor measurements for instrument errors and a layout unit for improving the conformity of the portion of the floor plan to a set of layout rules. The apparatus may also comprise the sensors that made the measurements.

15 Claims, 4 Drawing Sheets

(56) References Cited

OTHER PUBLICATIONS

Dioso A et al: "Laser Scan Matching in Polar Coordinates with Application to SLAM", Aug. 2, 2005, 2005 IEEE/RSJ Conference, Edmonton, CA, pp. 1439-1444, fig.4.

Feng Lu: "Shape Registration Using Optimization. For Mobile Robot Navigation", Dec. 31, 1995, http://web.cs.dal.ca/~eem/cvWeb/pubs/LUFENG_THESIS.pdf, pp. 7,9,19,21,33,108.

* cited by examiner

APPARATUS, TOOL, AND METHOD FOR MODIFYING A PORTION OF A FLOOR PLAN BASED ON MEASUREMENTS MADE BY ONE OR MORE SENSORS

BACKGROUND OF THE INVENTION

1. Field of the Invention

The present invention relates to floor plans.

2. Description of the Prior Art

Floor plans of existing buildings were traditionally measured using a tape measure. The emergence of handheld measuring devices equipped with sensors now makes it possible to make measurements and transfer these measurements directly to specialized drawing software. An example of handheld measuring devices includes laser range finders, which send a laser pulse in a narrow beam towards the object and measure the time taken by the pulse to be reflected off the target and returned to the device. An example of a handheld device is the Disto, which is a laser distance finder that transmits measurements wirelessly to software running on a remote computer.

Many factors influence the precision of measurements made by a sensor: the quality of the device components, the precision of the assembly, the qualifications of the operator, the care taken while manipulating the device, the environmental conditions during the operation such as the presence of furniture, the loss of precision during data transmission or subsequent computations, and limitations due to the inner workings of the sensor. These factors can be grouped into two categories: those inherent to the sensor, which can be approximated using a sensor error model, and those related to operating conditions, which can be approximated using an operation error model.

An example of error source inherent to a sensor is gyroscopic drift, which can be approximated using an error model. Over short periods of time, angles measured using a gyroscope tend to drift at a nearly constant rate.

Using measurements made by angular sensors to draw a floor plan may also introduce a scale uncertainty. In fact, knowing the angles between all segments of a floor plan is insufficient to determine the distance between two points.

Obtaining a consistent and satisfying floor plan based on real life measurements is a challenge. For instance, one might want to compensate measures for measurement errors while keeping some angles square and some walls parallel. Greater sensor imprecision implies greater error compensation and makes floor plan consistency more difficult to maintain. One might also want to compensate for imperfections in the building being measured, such as the compression or expansion of construction materials over time, deformation due to tensions in the structure, movements caused by environmental forces such as wind, water or ground movements, or simply construction errors that were made when the building was built or repaired.

In many circumstances, a highly accurate floor plan may appear crooked to the reader, as it makes non-square angles and non-parallel walls stand out. An idealized version of the floor plan may then prove more useful in these cases.

SUMMARY OF THE INVENTION

In an aspect of the invention, there is provided an apparatus for modifying a portion of a floor plan based on measurements made by one or more sensors. The apparatus comprises a correction unit for compensating the sensor measurements for instrument errors, and a layout unit for improving the conformity of the floor plan to a set of layout rules. In specific embodiments, the apparatus may also comprise one or more of the sensors that made the measurements.

In another aspect of the invention, a tool for modifying a portion of a floor plan based on measurements made by one or more sensors is provided. The tool is adapted to run on an electronic device and comprises a correction unit for compensating the sensor measurements for instrument errors and a layout unit for improving the conformity of the floor plan to a set of layout rules.

In another aspect of the invention, a method for modifying a portion of a floor plan based on measurements made by one or more sensors is provided. The method consists in maximizing an objective function combining several of the following rules while ensuring that the modified portion of the floor plan remains substantially similar to the original: maximizing the number of square angles between the walls, maximizing symmetry between two series of walls, making angles square or non-square based on user specifications, preventing wall segments from intersecting anywhere but at their extremities, preventing flat angles between connected wall segments, minimizing a translation, a rotation, or a scaling of elements comprised in the floor plan, ensuring that a translation, a rotation, or a scaling of elements comprised in the floor plan does not exceed a given threshold, aligning walls to axes of one or more orthogonal coordinate systems, minimizing the difference between the floor plan and a reference floor plan, or maximizing the correspondence of properties of the floor plan to a set of properties extracted from a database of reference floor plans.

DESCRIPTION OF THE PREFERRED EMBODIMENTS

Figure 1:
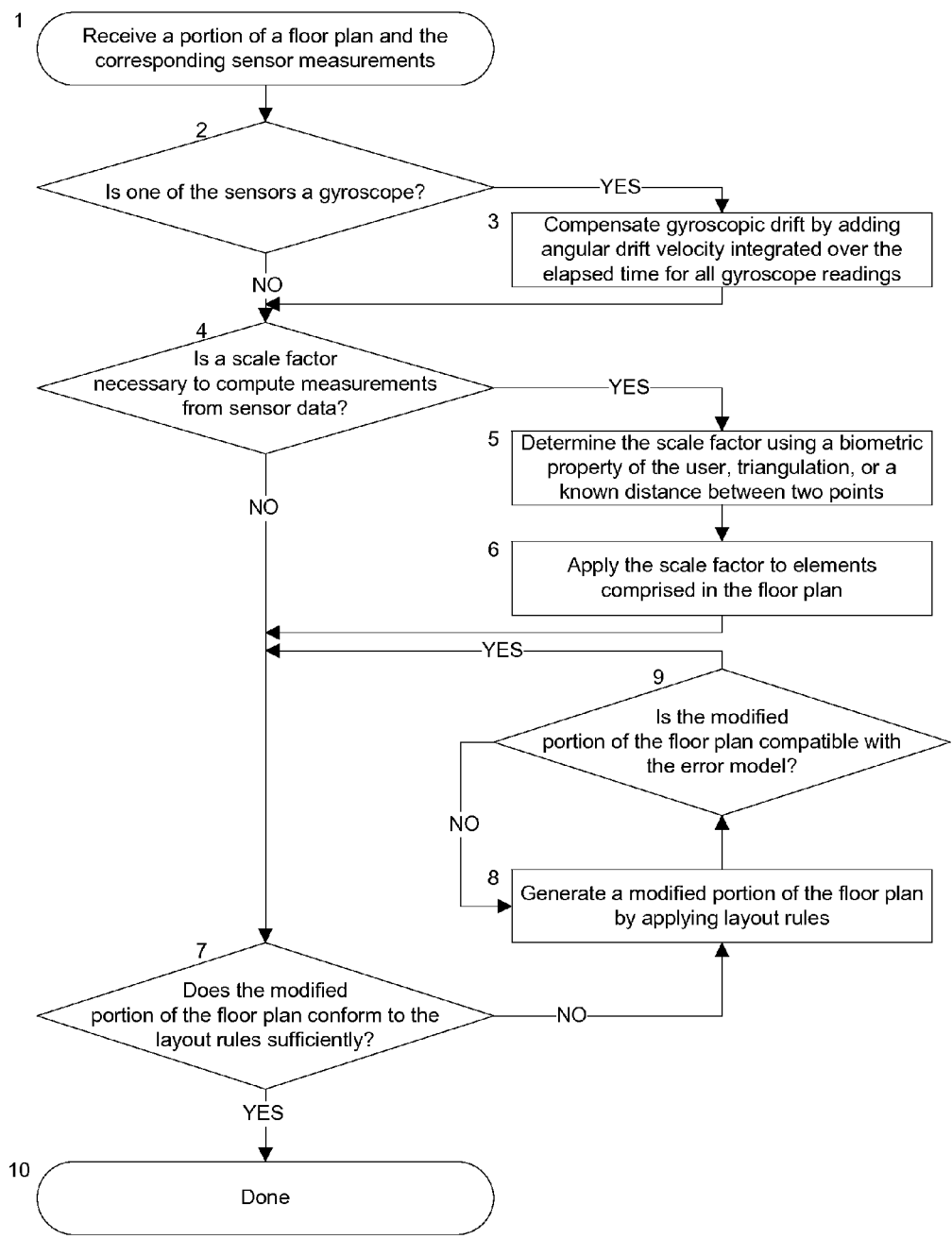
FIG. 1 is an example of a simplified flow chart representing the various steps of the method.

Reference is now made to FIG. 1, wherein there is shown an example of a simplified flow diagram describing the various steps of the method.

According to one of the preferred embodiments of the invention, the steps of compensating for the gyroscopic drift and for the scale factor can be performed in any order or simultaneously.

According to another preferred embodiment of the invention, the steps of verifying if the modified floor plan conforms to the layout rules 7, generating a modified floor plan 8, and verifying if the modified portion of the floor plan is compatible with the error model 9 are constrained by computation time and may be performed by any Monte Carlo algorithm that guarantees a predetermined execution time but not an optimal solution, such as a Monte Carlo method, particle swarm optimization, Newton's method, a quasi-Newton method, a gradient ascent or descent, a genetic algorithm, or simulated annealing.

According to another preferred embodiment of the invention, the steps of verifying if the modified floor plan conforms to the layout rules 7, generating a modified floor plan 8, and verifying if the modified portion of the floor plan is compatible with the error model 9 are not constrained by computation time and may be performed by any Las Vegas algorithm that is guaranteed to find an optimal solution regardless of the time taken, such as brute-force search or a simplex algorithm.

According to another preferred embodiment of the invention, the step of generating a modified floor plan 8 attempts to align most or all the walls to the axes of a single orthogonal coordinates system. Walls at an angle too far to be aligned to the axes of the orthogonal coordinates system are left unchanged.

According to another preferred embodiment of the invention, the step of generating a modified floor plan 8 first identifies one or more orthogonal coordinates systems by grouping together walls whose angles are close one to another, give or take a right angle. Walls are then aligned to these orthogonal coordinates system. Walls at an angle that is too far to be aligned to the axes of any orthogonal coordinates system are left unchanged.

According to another preferred embodiment of the invention, the step of generating a modified floor plan 8 generates an idealized floor plan that matches the expectations of a user looking at the building interior.

According to another preferred embodiment of the invention, the step of generating a modified floor plan 8 generates a floor plan that maximizes one or more principles of architecture, such as durability, utility, and beauty. Ideas behind these principles can be formalized using a set of proportions, an algorithm, or expressed as layout rules.

According to another preferred embodiment of the invention, the step of verifying if the modified portion of the floor plan is compatible with the error model 9 favors an idealized floor plan over a precise one and accepts floor plans that are not compatible with the error model.

According to another preferred embodiment of the invention, the step of verifying if the modified floor plan conforms to the layout rules 7 presents multiple corrected floor plans as candidates to the user by means of a screen. The user then selects the one that is closest to reality by means of an input unit or rejects them all if none are acceptable.

According to another preferred embodiment of the invention, the step of verifying if the modified floor plan conforms to the layout rules 7 may be interrupted at any point by the user. The floor plan that conforms the most to the layout rules at that point is then retained.

According to another preferred embodiment of the invention, the portion of the floor plan targeted by the method may contain a few wall segments, a whole room, multiple rooms, or a complete floor plan.

According to another preferred embodiment of the invention, the step of generating a modified floor plan 8 uses an error model that takes into account errors inherent to the sensors, such as limited precision or signal noise.

According to another preferred embodiment of the invention, the step of verifying if the modified portion of the floor plan is compatible with the error model 9 uses an error model that takes into account errors inherent to the sensors, which can be approximated using a sensor error model, as well as errors related to operating conditions, such as user inexperience, obscured visibility, biometric properties of the user or operation errors.

According to another preferred embodiment of the invention, the step of determining a scale factor using a biometric property of the user 5 relies on properties such as the total height of the user, the distance between his eyes and the ground, the length of his arms or arm segments, the angle of his elbows or shoulders, the focal distance of his eyes, or his posture while holding the device.

Figure 2:
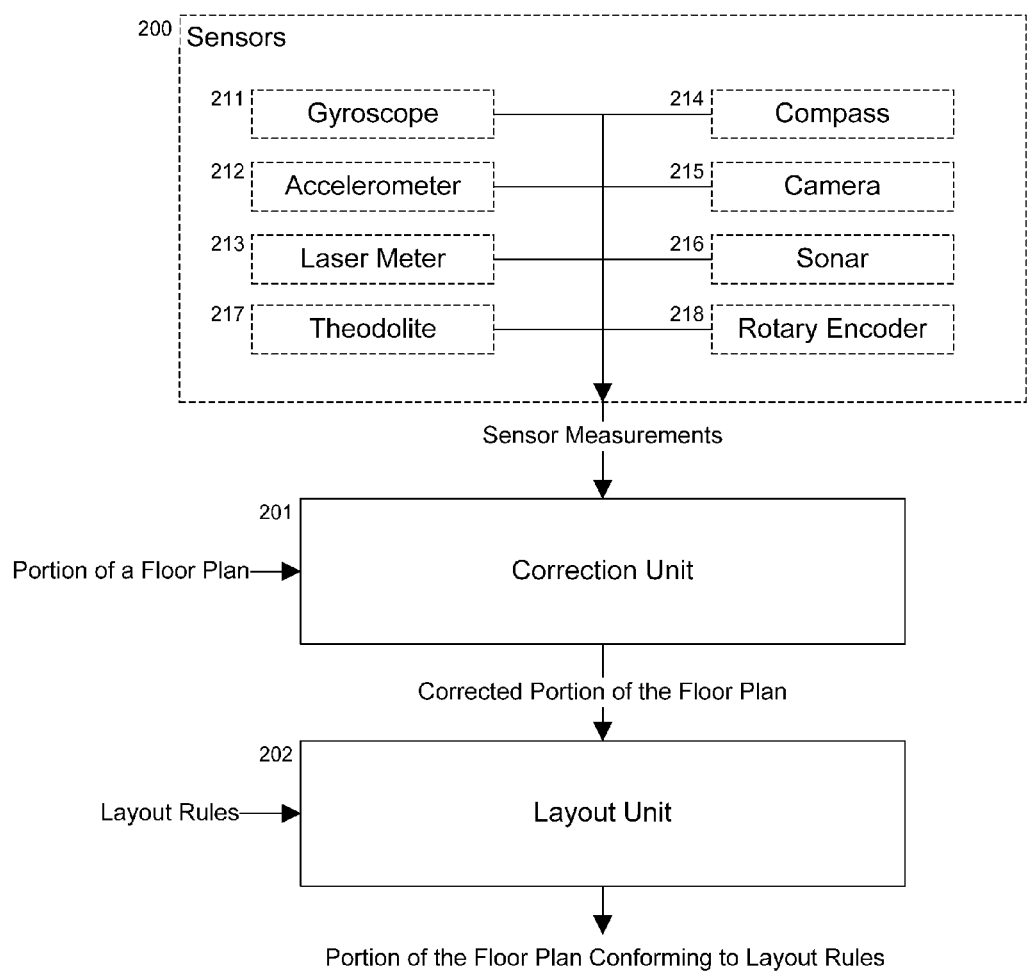
FIG. 2 is an example of a simplified representation of the components of the apparatus, namely a correction unit, a layout unit, and, optionally, one or more sensors.

Reference is now made to FIG. 2, wherein there is shown an example of a simplified representation of the components of the apparatus, namely a correction unit 201, a layout unit 202, and, optionally, one or more sensors 200. It is understood that the components of the apparatus can be located on any number of physical devices.

According to one of the preferred embodiments of the invention, the sensors 200, the correction unit 201, and the layout unit 202 are all located on a single device and communicate directly one with another.

According to another preferred embodiment of the invention, some or all of the sensors 200 are all located on separate devices. The measurements are transmitted to the correction unit 201 and to the layout unit 202 using one or more cables, using wireless communication units, or via a local network or the Internet.

According to another preferred embodiment of the invention, the sensors 200 store the measurements to a storage unit such as RAM memory, flash memory, a memory stick, a memory card, or a hard drive. The correction unit 201 and the layout unit 202 then read the measurements from the storage unit.

According to another preferred embodiment of the device, the device is a portable device such as a cellular phone, a smartphone, a laser meter, a PDA (Personal Digital Assistant), a tablet, a digital camera, or a laptop computer.

According to another preferred embodiment of the invention, the device performs all or part of its computations by means of a remote computer. The device may be connected to the remote computer wirelessly or with a cable. The remote computer may be situated near the device, allowing communication protocols such as Bluetooth or Wifi to be used, or it may be in a remote location, in which case it can be accessed via the Internet.

Figure 3:
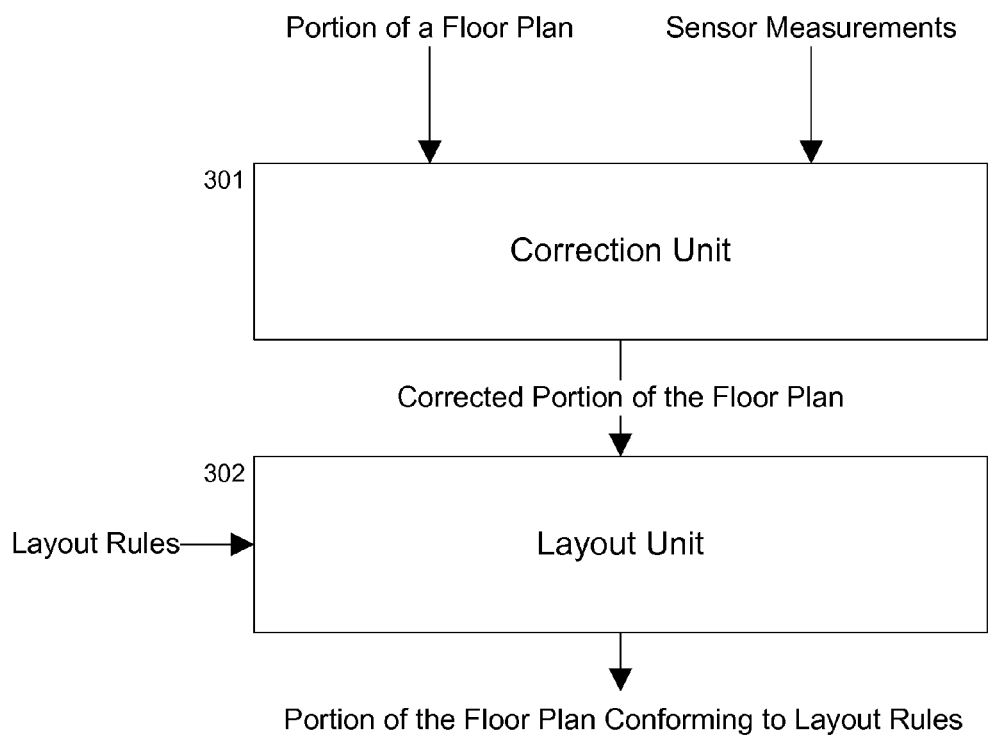
FIG. 3 is an example of a simplified representation of the components of the tool, namely a correction unit and a layout unit.

Reference is now made to FIG. 3, wherein there is shown an example of a simplified representation of the components of the tool, namely a correction unit 301 and a layout unit 302.

According to one of the preferred embodiments of the invention, the measurements are contained in the floor plan, allowing the correction unit 301 to re-position the points when compensating measurements using an error model.

According to another preferred embodiment of the invention, the measurements and the floor plan are received separately and there is a referencing mechanism between the two data sets. A first option is to have each measurement reference elements comprised in the floor plan as dependencies, allowing the correction unit 301 to modify the elements when compensating the measurements. Another option is for each element comprised in the floor plan to indicate which measurements it depends on, allowing the correction unit 301 to re-compute the measurements when modifying the elements on the floor plan. Both referencing mechanisms may be used simultaneously, allowing back and forth computations.

According to another preferred embodiment of the invention, the user specifies which angles defining the floor plan must be square or which angles must not be square by means of an input unit. The step of generating a modified floor plan 7 then generates floor plans whose angles conform to the user specifications.

According to one of the preferred embodiments of the invention, the tool is downloaded onto the device using a memory card, a memory stick, a cable connected to a computer, a cable connected to a network, or a wireless network connection.

According to another preferred embodiment of the invention, the tool is integrated with the device, either as a pre-installed application or an extension of the operating system. The application may be stored in ROM (Read-Only Memory) or implemented using electronic components.

According to another preferred embodiment of the invention, the tool is adapted to run on a portable device such as a cellular phone, a smartphone, a laser meter, a PDA (Personal Digital Assistant), a tablet, a digital camera, or a laptop computer.

Figure 4:
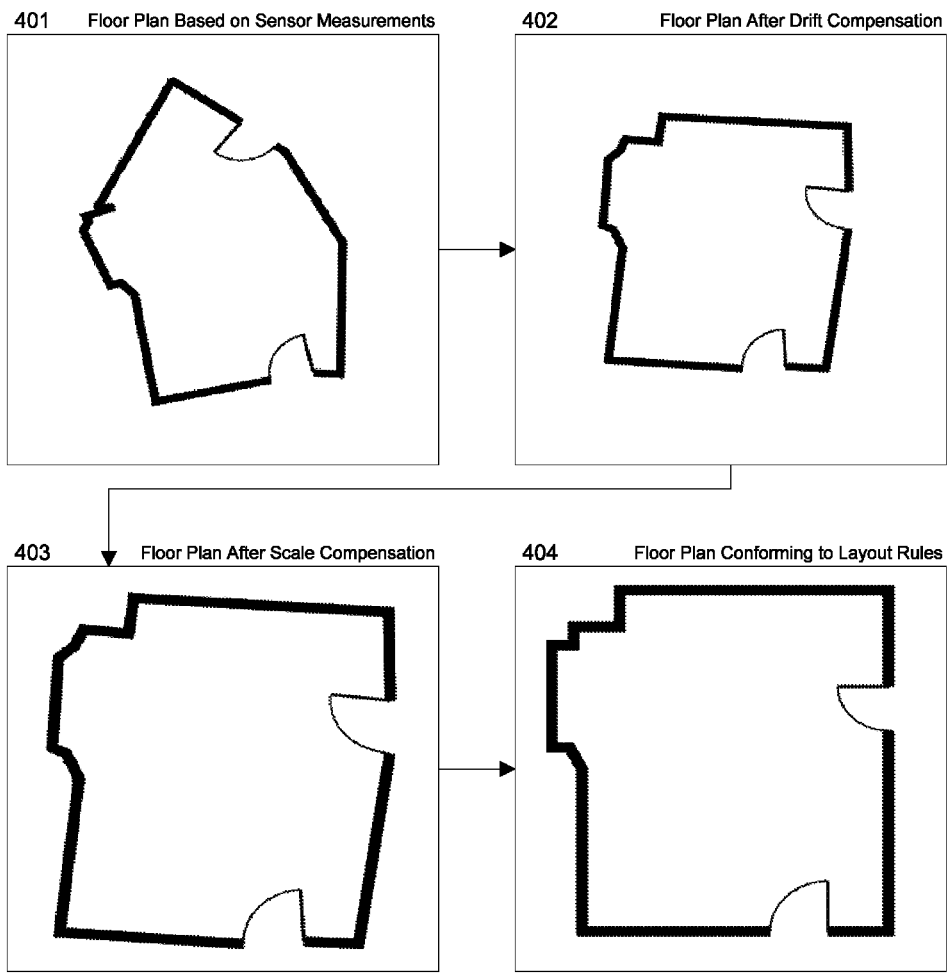
FIG. 4 illustrates a floor plan drawn using the original sensor measurements and shows how it is modified at the various steps, specifically after drift compensation, after scale compensation, and after conforming to layout rules.

Reference is now made to FIG. 4, wherein there is shown an illustration of a floor plan drawn using the original sensor measurements 401, how it is modified at the various steps, specifically after drift compensation 402, after scale compensation 403, and after conforming to layout rules 404.

According to one of the preferred embodiments of the invention, the scale factor was known at the time the measurements were initially made and scale compensation 403 is an optional step.

According to another preferred embodiment of the invention, gyroscopic drift compensation 402 is approximated by using a constant drift velocity.

According to another preferred embodiment of the invention, gyroscopic drift is considered negligible and the step of compensating gyroscopic drift 402 is skipped.

According to another preferred embodiment of the invention, the portion of the floor plan is never actually drawn or represented visually by the apparatus, the tool, or the method. The portion of the floor plan is only manipulated as data, such as a set of points, coordinates, matrices, or an array of floating point numbers. This data can be stored in an XML file, a database, or a file readable by a CAD software.

What is claimed is:

1. A device for modifying a portion of a floor plan based on measurements made by one or more sensors, the device comprising:
   a correction unit adapted for:
      receiving the sensor measurements;
      compensating the sensor measurements for instrument errors;
      performing a translation, a rotation, or a scaling of elements comprised in the floor plan to reflect the compensated sensor measurements;
   a layout unit adapted for:
      identifying one or more orthogonal coordinates systems by grouping together walls whose angles are close one to another;
      modifying the portion of the floor plan by aligning most or all the walls to axes of the orthogonal coordinates systems while ensuring that the modified portion of the floor plan remains similar to the original.

2. The device of claim 1, further comprising at least one of the following sensors, the device using the measurements made by the sensor when modifying the portion of the floor plan:
   a gyroscope;
   an accelerometer;
   a laser distance meter;
   a sonar;
   a compass;
   a theodolite;
   a camera;
   a rotary encoder.

3. The device of claim 1, wherein some of the sensor measurements come from a gyroscope and compensating the sensor measurements for instrument errors performs the following computation or its equivalent:
   computing an angular drift by subtracting an angle between two gyroscope measurements from an expected angle between said gyroscope measurements;
   computing an angular drift velocity by dividing the angular drift by a time elapsed between the two gyroscope measurements;
   for all gyroscope measurements, computing a compensated gyroscope measurement by adding to the measurement an angle equal to a time integration of the angular drift velocity from a reference point in time up to the time of the gyroscope measurement;
   modifying the portion of the floor plan using the compensated gyroscope measurements.

4. The device of claim 1, wherein the correction unit applies a scale factor to elements comprised in the portion of the floor plan, the scale factor being determined using one of the following values:
   a biometric property of the user holding a sensor;
   a distance between a sensor and a reference point;
   a distance between a sensor and a reference plane;
   a ratio between an expected distance and the same distance computed using sensor measurements;
   a triangulation using sensor measurements made from two locations separated by a known distance;
   a combination of the above.

5. The device of claim 1, wherein the layout unit further performs at least one of the following:
   maximizing the number of square angles between the walls;
   maximizing symmetry between two series of walls;
   making angles square or non-square based on user specifications;
   preventing wall segments from intersecting anywhere but at their extremities;
   preventing flat angles between connected wall segments;
   minimizing a translation, a rotation, or a scaling of elements comprised in the floor plan;
   ensuring that a translation, a rotation, or a scaling of elements comprised in the floor plan does not exceed a given threshold;
   minimizing the difference between the floor plan and a reference floor plan;
   maximizing the correspondence of properties of the floor plan to a set of properties extracted from a database of reference floor plans;
   maximizing an objective function combining several of the above rules.

6. The device of claim 1, wherein the measurements that would have yielded the modified portion of the floor plan are compatible with at least one of the following:
   the error model of the sensors;
   operation errors while making the measurements.

7. A computer-implementable tool for modifying a portion of a floor plan based on measurements made by one or more sensors, the tool comprising instructions that can be downloaded electronically or wirelessly to and executed on an electronic device, the tool comprising:
   a correction unit adapted for:
      receiving the sensor measurements;
      compensating the sensor measurements for instrument errors;

performing a translation, a rotation, or a scaling of elements comprised in the floor plan to reflect the compensated sensor measurements;

a layout unit adapted for:
identifying one or more orthogonal coordinates systems by grouping together walls whose angles are close one to another;
modifying the portion of the floor plan by aligning most or all the walls to axes of the orthogonal coordinates systems while ensuring that the modified portion of the floor plan remains similar to the original.

8. The tool of claim 7, adapted to run on an electronic device further comprising at least one of the sensors that made the measurements and wherein the sensor is one of the following:
a gyroscope;
an accelerometer;
a laser distance meter;
a sonar;
a compass;
a theodolite;
a camera;
a rotary encoder.

9. The tool of claim 7, wherein some of the sensor measurements come from a gyroscope and compensating the sensor measurements for instrument errors performs the following computation or its equivalent:
computing an angular drift by subtracting an angle between two gyroscope measurements from an expected angle between said gyroscope measurements;
computing an angular drift velocity by dividing the angular drift by a time elapsed between the two gyroscope measurements;
for all gyroscope measurements, computing a compensated gyroscope measurement by adding to the measurement an angle equal to a time integration of the angular drift velocity from a reference point in time up to the time of the gyroscope measurement;
modifying the portion of the floor plan using the compensated gyroscope measurements.

10. The tool of claim 7, wherein the correction unit applies a scale factor to elements comprised in the portion of the floor plan, the scale factor being determined using at least one of the following values:
a biometric property of the user holding the sensor;
a distance between a sensor and a reference point;
a distance between a sensor and a reference plane;
a ratio between an expected distance and the same distance computed using sensor measurements;
a triangulation using sensor measurements made from two locations separated by a known distance;
a combination of the above.

11. The tool of claim 7, wherein the layout unit improves the conformity of the portion of the floor plan to at least one of the following layout rules while ensuring that the modified portion of the floor plan remains similar to the original:
maximizing the number of square angles between the walls;
maximizing symmetry between two series of walls;
making angles square or non-square based on user specifications;
preventing wall segments from intersecting anywhere but at their extremities;
preventing flat angles between connected wall segments;
minimizing a translation, a rotation, or a scaling of elements comprised in the floor plan;
ensuring that a translation, a rotation, or a scaling of elements comprised in the floor plan does not exceed a given threshold;
minimizing the difference between the floor plan and a reference floor plan;
maximizing the correspondence of properties of the floor plan to a set of properties extracted from a database of reference floor plans;
maximizing an objective function combining several of the above rules.

12. The tool of claim 7, wherein the measurements that would have yielded the modified portion of the floor plan are compatible with at least one of the following:
the error model of the sensors;
operation errors while making the measurements.

13. A method for modifying a portion of a floor plan based on measurements made by one or more sensors using an electronic device, the method comprising:
receiving the sensor measurements;
compensating the sensor measurements for instrument errors;
performing a translation a rotation, or a scaling of elements comprised in the floor plan to reflect the compensated sensor measurements;
identifying one or more orthogonal coordinates systems by grouping together walls whose angles are close one to another;
modifying the portion of the floor plan by aligning most or all the walls to axes of the orthogonal coordinates systems while ensuring that the modified portion of the floor plan remains similar to the original.

14. The method of claim 13, wherein the measurements that would have yielded the modified portion of the floor plan are compatible with at least one of the following:
the error model of the sensors;
operation errors while making the measurements.

15. The method of claim 13, wherein compensating sensor measurements for instrument errors applies a scale factor to elements comprised in the portion of the floor plan, the scale factor being determined using one of the following values:
a biometric property of the user holding a sensor;
a distance between a sensor and a reference point;
a distance between a sensor and a reference plane;
a ratio between an expected distance and the same distance computed using sensor measurements;
a triangulation using sensor measurements made from two locations separated by a known distance;
a combination of the above.

* * * * *